(12) United States Patent
Mayer

(10) Patent No.: US 7,506,795 B2
(45) Date of Patent: Mar. 24, 2009

(54) METHOD AND APPARATUS FOR THERMALLY COUPLING A HEAT DISSIPATION DEVICE TO A MICROELECTRONIC DEVICE

(75) Inventor: Steve M. Mayer, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 11/012,014

(22) Filed: Dec. 13, 2004

(65) Prior Publication Data
US 2005/0138800 A1 Jun. 30, 2005

(51) Int. Cl.
*B23K 20/00* (2006.01)
*B23K 35/12* (2006.01)

(52) U.S. Cl. ............... 228/194; 228/180.1; 228/246

(58) Field of Classification Search ............ 228/178, 228/179, 180.1, 180.21, 180.22, 245, 246, 228/200, 222, 233.2, 234.1, 46, 194
See application file for complete search history.

(56) References Cited

U.S. PATENT DOCUMENTS

| | | | |
|---|---|---|---|
| 4,284,466 A | 8/1981 | Chayka et al. | |
| 5,197,651 A | 3/1993 | Nakamura et al. | |
| 5,230,462 A | 7/1993 | Vascak et al. | |
| 5,783,867 A * | 7/1998 | Belke et al. | ........... 257/783 |
| 6,271,469 B1 * | 8/2001 | Ma et al. | ............ 174/521 |
| 6,347,734 B1 | 2/2002 | Downes | |

FOREIGN PATENT DOCUMENTS

JP 08 218 166 8/1996

\* cited by examiner

*Primary Examiner*—Kevin P Kerns
*Assistant Examiner*—Megha Mehta
(74) *Attorney, Agent, or Firm*—Kathy J. Ortiz

(57) ABSTRACT

Apparatus and methods are provided for thermally coupling a heat dissipation device to a microelectronic device. A reflowable thermal interface material is applied between the back side of a microelectronic die and a heat dissipation device. Heat and pressure is conducted through the heat dissipation device to the interface material and producing thereby liquefaction followed by solidification of the interface material, the solidification occurring progressively from the center to the peripheral edge. A thermal compression bonding apparatus is provided comprising a bonding head adapted to apply heat and pressure to the heat dissipation device whereby providing the desired thermal profile to effect solidification of the interface material from the center outward.

6 Claims, 5 Drawing Sheets

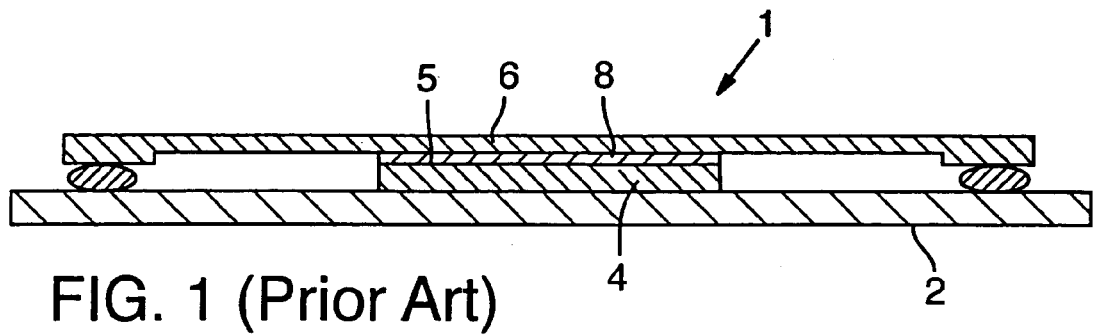
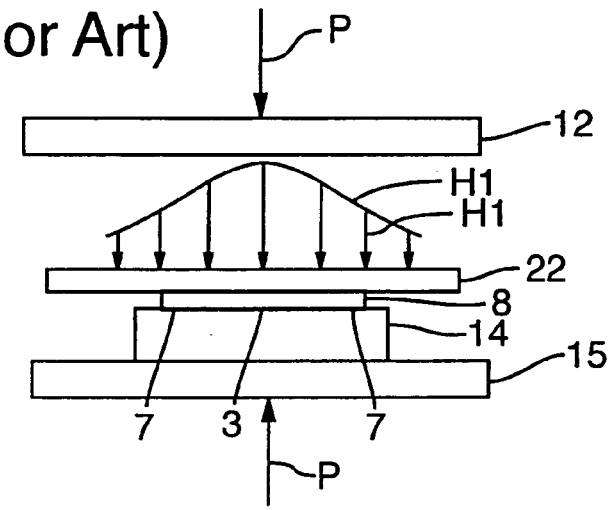
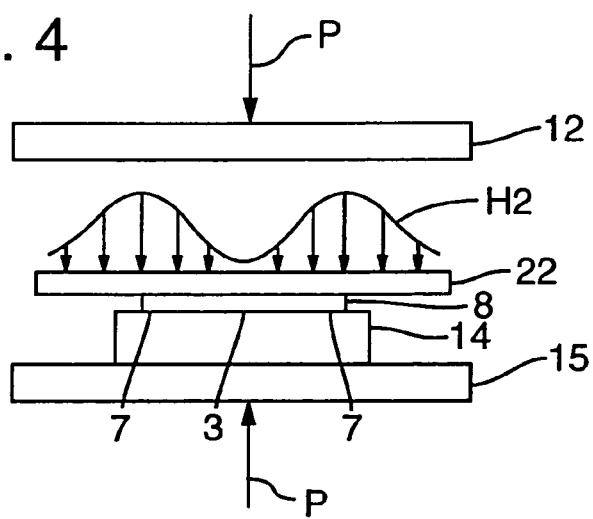

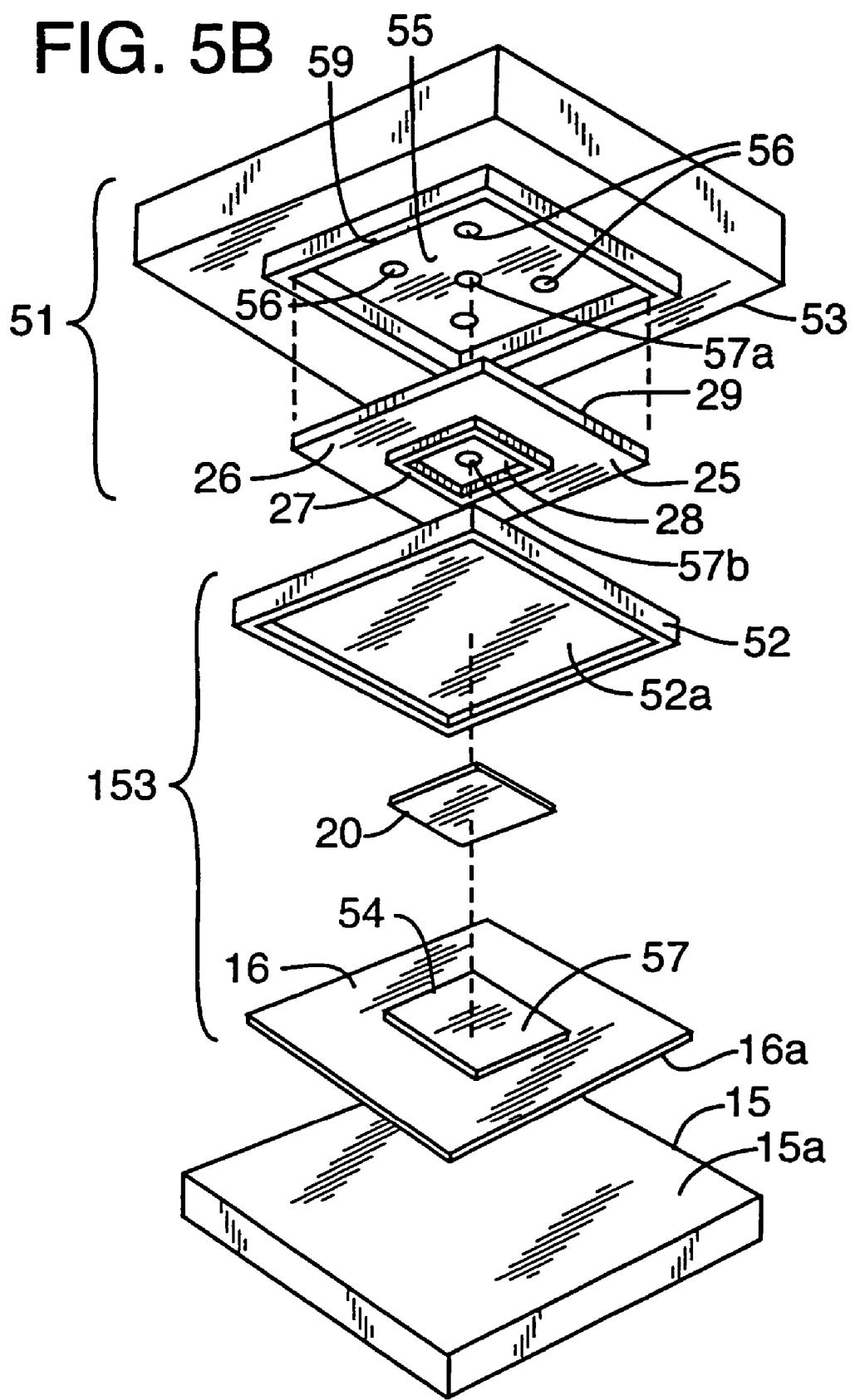

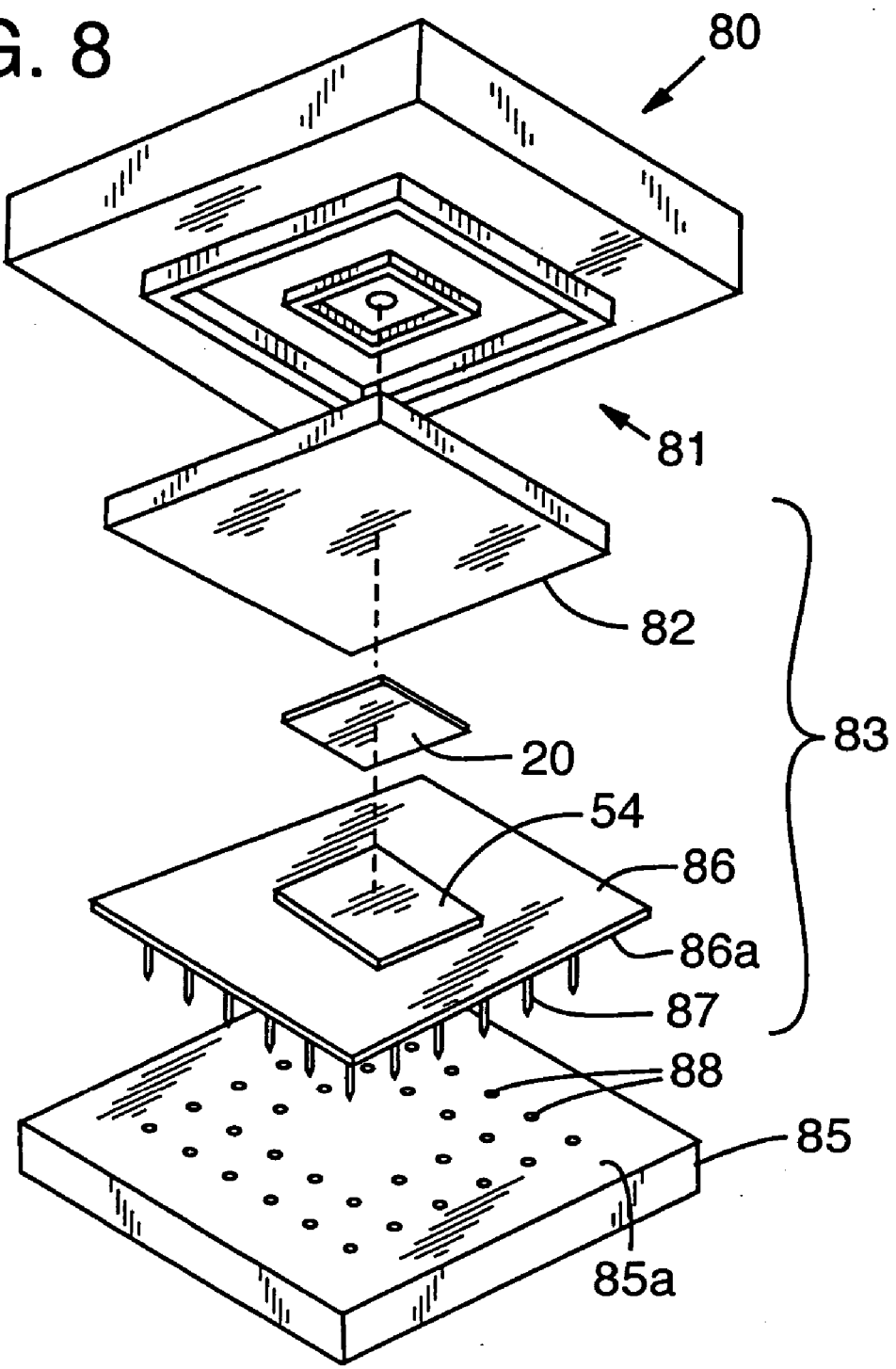

METHOD AND APPARATUS FOR THERMALLY COUPLING A HEAT DISSIPATION DEVICE TO A MICROELECTRONIC DEVICE

FIELD OF THE INVENTION

The present invention relates to apparatus and methods for removal of heat from electronic devices, and more particularly, to the manner of thermally coupling a heat dissipation device to the back side surface of a microelectronic die.

BACKGROUND OF INVENTION

Higher performance, lower cost, increased miniaturization of integrated circuit components, and greater packaging density of integrated circuits are ongoing goals of the computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of a heat dissipation device, such as an integrated heat spreader, high surface area heat sink, heat slug, among others, to the microelectronic die. FIG. 1 is a cross-sectional view of a microelectronic package 1 comprising a microelectronic die 4. (illustrated as a flip chip) physically and electrically attached to a carrier substrate 2, and an integrated heat spreader 6. The integrated heat spreader 6 is thermally coupled to a back surface 5 of the microelectronic die 4 by a thermal interface material 8, such as solder. The integrated heat spreader 6 is usually constructed from a material with a high thermal conductivity, such as copper, copper alloys, aluminum, aluminum alloys, among others. The thermal interface material 8 is by it's composition thermally conductive. The heat generated by the microelectronic die 4 is drawn into the integrated heat spreader 6 through the thermal interface material 8 (following the path of least thermal resistance) by conductive heat transfer.

A critical factor in effectively conducting heat from the microelectronic die 4 to the integrated heat spreader 6 is a good thermally conductive bond or coupling between the back surface 5 of the microelectronic die 4 and the integrated heat spreader 6. The use of thermal interface material 8 between the back surface 5 of the microelectronic die 4 and the integrated heat spreader 6 is a technique to enhance thermal contact between the components. The thermal interface material 8 has the ability to reflow (soften and/or melt) at elevated temperatures and conform to and physically bond with the surfaces in which it is in contact.

One process attempted in the art to reflow the thermal interface material 8 and provide thermal coupling between the microelectronic die 4 and the integrated heat spreader 6 is thermal compression bonding. FIGS. 2A and 2B are partial cross-sectional exploded and assembled views, respectively, of a thermal compression bonding apparatus 10 and microelectronic package 13 known in the art. The microelectronic package 13 comprises a carrier substrate 16 having a substrate active side 19, a microelectronic die 14 (illustrated as a flip chip) having a die active side 21 and a back side 17, a thin sheet or layer of thermal interface material 8, for example a solder preform, and an integrated heat spreader 22. The die active side 21 is physically and electrically coupled to the substrate active side 19 using conventional methods. The reflowable thermal interface material 8 couples the integrated heat spreader 22 to the back side 17 of the microelectronic die 14 by thermal compression bonding.

The thermal compression bonding apparatus 10 consists essentially of a bonding head 11 and a support base 15. In operation, the components of the microelectronic package 13 are placed between the bonding head 11 and a support base 15. The bonding head 11 has a projecting contact surface 12 that provides a continuous surface slightly larger in lateral dimension than the back side 17 of the microelectronic die 14 as well as the thermal interface material 8. The bonding head 11 provides heat to the contact surface 12.

The thermal compression bonding apparatus 10 applies clamping pressure to the microelectronic package 13 between the bonding head 11 and the support base 15. The bonding head 11 is positioned such that the contact surface 12 is in abutment with the heat dissipation device 22 and centered relative to the back side 17 of the microelectronic device 14. Clamping pressure between the bonding head 11 and the support base 15 provides urging engagement between the integrated heat spreader 22, the thermal interface material 8, and the microelectronic die 14. Heat from the bonding head 11 is conducted through the contact surface 12 and through the integrated heat spreader 22 to heat and reflow the thermal interface material 8. The combination of heating and pressure contribute to the formation of the coupling or bond between the integrated heat spreader 22, the thermal interface material 8, and the microelectronic die 14.

In practice, the resulting coupling provided by the thermal interface material 8 between the integrated heat spreader 22 and the microelectronic die 14 is found to be unsatisfactory. Microcracking, embrittlement, and entrapment of solder components, such as flux, in the case of solder, within the thermal interface material 8 is found post thermal compression bonding, all of which are detrimental to thermal conduction. Therefore, thermal compression bonding is not extensively used in the production of microelectronic packages 13.

The benefits of using the thermal compression bonding apparatus 10 include a very short processing time as compared with alternative methods that use clamps to hold the components together while the assembly is heated within a furnace. The thermal compression bonding apparatus 10 can provide the clamping force and heat required for the process. The bonding head 11 can provide the necessary heat much more quickly than the furnace methods. The benefits, though, are outweighed by the inferior coupling produced by the process. Therefore, it is desired in the art to develop thermal compression bonding apparatus and methods to quickly and effectively produce a thermally conductive coupling between the microelectronic die and the integrated heat spreader.

BRIEF DESCRIPTION OF DRAWINGS

FIG. 1 is a side cross-sectional view of a heat dissipation device attached to a microelectronic die known in the art;

FIG. 3 illustrates the thermal profile provided to the solder by the bonding head of the thermal compression bonding apparatus known in the art;

FIG. 4 illustrates a desired thermal profile in accordance with an embodiment with the present invention;

FIGS. 5A, 5B and 5C are exploded partial cross-sectional, exploded perspective, and assembled partial cross-sectional views, respectively, of a thermal compression bonding apparatus and microelectronic package in accordance with an embodiment of the present invention;

FIG. 8 is an exploded perspective view of another embodiment of a thermal compression bonding apparatus in accordance with an embodiment of the present invention.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 2A:
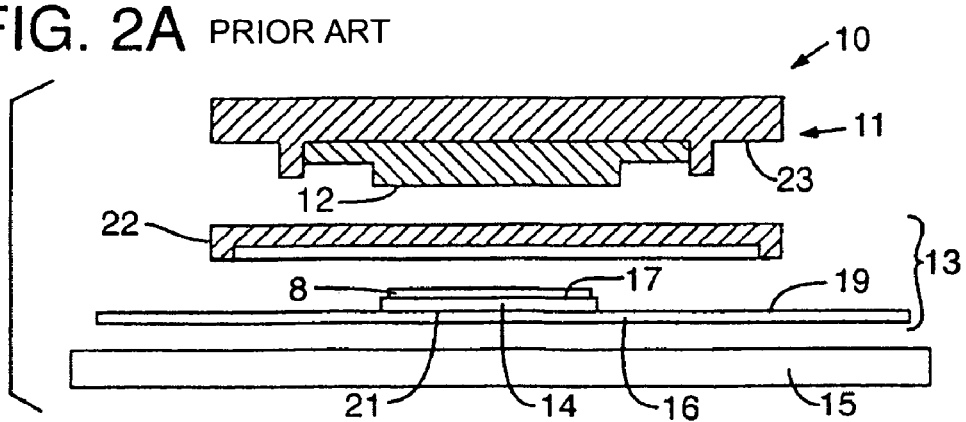
FIGS. 2A and 2B are partial cross-sectional exploded and assembled views, respectively, of a thermal compression bonding apparatus and microelectronic package known in the art.
Figure 2B:
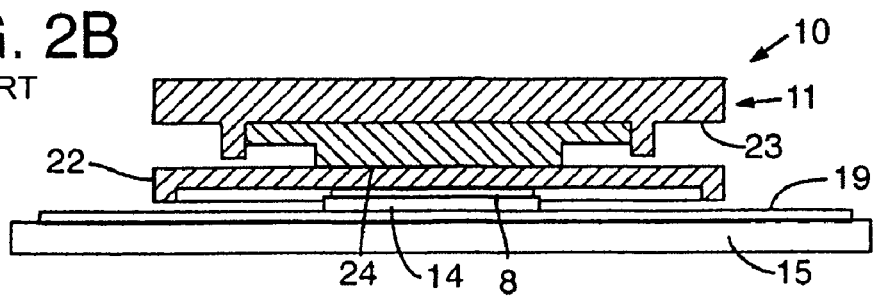

As discussed earlier, the present thermal compression bonding apparatus 10 produces an unsatisfactory thermal conductive coupling between the integrated heat spreader 22 and the microelectronic die 14 shown in FIG. 2A. The unsatisfactory coupling is due to microcracking, embrittlement, and entrapment of solder components, such as flux, in the case of solder, within the thermal interface material 8, all of which are detrimental to thermal conduction.

FIG. 3 illustrates the thermal profile H1 provided to the thermal interface material 8 by the bonding head 11 of the thermal compression bonding apparatus 10 known in the art. The length of the arrows and the shape of the curve of the thermal profile H1 illustrate the thermal gradient found across the thermal interface material 8. It is found that the temperature is highest towards the center 3 of the thermal interface material 8 with lower temperature around the peripheral edge 7. Therefore, the center 3 of the thermal interface material 8 is the first to melt during the heating portion of thermal compression bonding and the last to solidify during the cooling off or heat removing portion of thermal compression bonding. As the temperature is reduced, the peripheral edge 7 of the thermal interface material 8 solidifies trapping impurities and components within the remaining molten center 3 of the thermal interface material 8. The pockets of impurities and flux cause localized weakening and precipitate microcracking of the thermal interface material 8 between the integrated heat spreader 22 and the microelectronic die 14. These impurities and components have been verified by experimentation.

Materials have a property known as a coefficient of thermal expansion which is a measure of dimensional change when the material undergoes expansion and contraction when heated and cooled. During the thermal compression bonding process, as the thermal interface material 8 is heated to melt, it expands, and when cooled to solid, contracts. During the cooling or heat removing process, the thermal interface material 8 solidifies and contracts beginning at the perimeter edge 7 and progressing towards the molten, expanded center 3. Subsequent contraction of the center 3 upon cooling causes the thermal interface material 8 to draw or pull apart and thus contribute to microcracking.

FIG. 4 illustrates a desired thermal profile H2 as provided in an embodiment in accordance with the present invention. In this embodiment, the length of the arrows and the shape of the curve of the thermal profile H2 illustrate a thermal gradient found across the thermal interface material 8 with the temperature being higher towards the peripheral edge 7 of the thermal interface material 8 and lower at the center 3. Therefore, the center 3 of the thermal interface material 8 is the last to melt during the heating portion of thermal compression bonding and the first to solidify during the cooling portion of thermal compression bonding. As the center 3 of the thermal interface material 8 solidifies, impurities and components within the thermal interface material 8, such as flux, migrate through the molten thermal interface material 8 away from the center 3 and towards the peripheral edge 7. This results in the thermal interface material 8 remaining substantially free of entrapped flux and impurities, minimizing the potential for microcracking and embrittlement. These results have been verified by experimentation.

During the thermal compression bonding process in accordance with the embodiment of FIG. 4, the thermal interface material 8 solidifies and contracts beginning with the center 3 and progressing towards the peripheral edge 7. As the thermal interface material 8 contacts, the molten peripheral edge 7 is able to flow or adjust to accommodate the contraction. With a thermal profile substantially shown as thermal profile H2, the resulting stress within the thermal interface material 8 caused by thermal contraction is greatly reduced.

The clamping pressure P between the bonding head 11 and the support base 15 provides urging engagement between the integrated heat spreader 22, the thermal interface material 8, and the microelectronic die 14 (carrier substrate 16 removed for simplicity) during thermal compression bonding. This clamping pressure P is adapted to ensure intimate contact between the integrated heat spreader 22 and the thermal interface material 8, and the microelectronic die 14 and the thermal interface material 8. It can be appreciated that too great a clamping pressure P will excessively extrude the thermal interface material 8, and too little will not ensure full contact between the integrated heat spreader 22, the thermal interface material 8, and the microelectronic die 14.

Figure 5A:
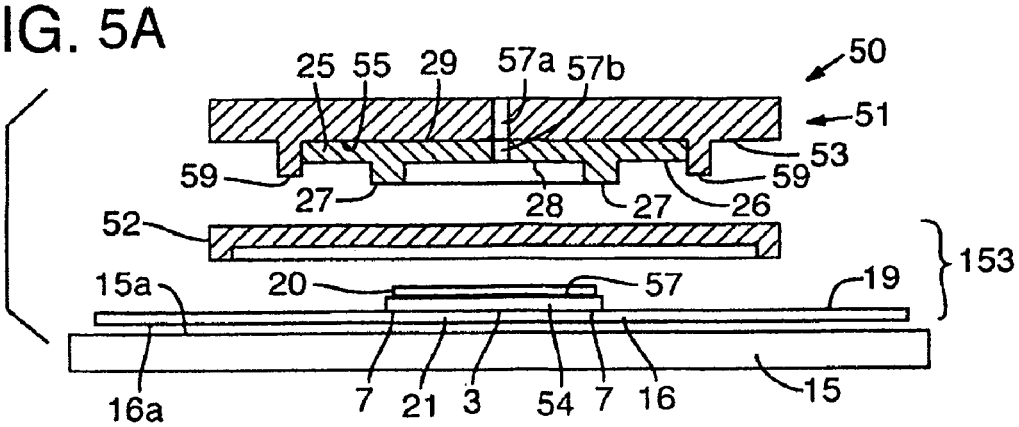
Figure 5C:
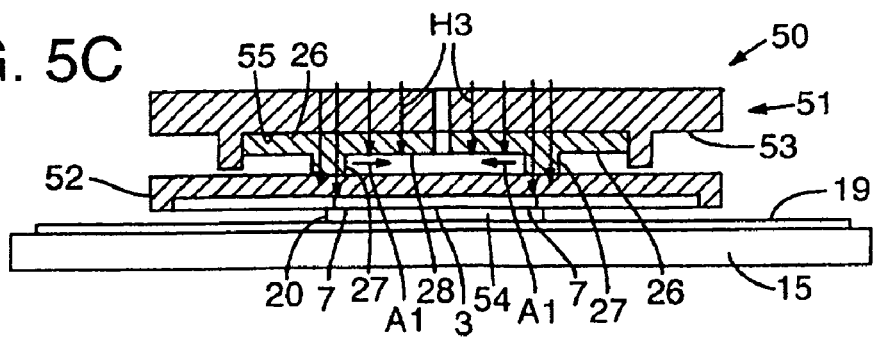

FIGS. 5A, 5B and 5C are exploded partial cross-sectional, exploded perspective, and assembled partial cross-sectional views, respectively, of a thermal compression bonding apparatus 50 and microelectronic package 153 in accordance with an embodiment of the present invention. The microelectronic package 153 comprises a carrier substrate 16 having a substrate active side 19, a microelectronic die 54 (illustrated as a flip chip) having a die active side 21 and a back side 57, a reflowable thermal interface material 20, and a heat dissipation device 52 (shown as an integrated heat spreader). The die active side 21 is physically and electrically attached to the substrate active side 19 using methods known in the art. The heat dissipation device 52 is coupled to the back side 57 of the microelectronic die 54 by the reflowable thermal interface material 20.

The reflowable thermal interface material 20 has the property of high thermal conduction with the ability of reflowability at elevated temperature. What is referred to as reflowability is the capability of softening or liquefying upon exposure to elevated temperature and resolidifying upon removal of the elevated temperature.

In accordance with an embodiment of the present invention, the reflowable thermal interface material 20 is a thin sheet of solder, also referred to as solder preform. Other configurations for the reflowable thermal interface material 20 include, but not limited to, foil, film, plating and coating. The reflowable thermal interface material 20 comprises any material suitable for the particular purpose, including leaded and lead-free solder, flux and flux-free solder, metal-filled conductive adhesives, and the like.

The heat dissipation device 52 is constructed from a material with a high thermal conductivity, such as copper, copper alloys, aluminum, aluminum alloys, among other materials. The heat dissipation device 52 can take a form other than the mentioned integrated heat spreader. Examples of heat dissipation devices 52 include heat slug and high surface-area heat sink, among others.

In accordance with an embodiment of the present invention, a thermal compression bonding apparatus 50 comprises a bonding head 51 and a support base 15. The bonding head 51 comprises a projecting contact ring 27 that defines an inner recessed portion 28. The projecting contact ring 27 provides a continuous ring-shaped surface defining the inner recessed portion 28 as being slightly smaller in lateral dimension than the back side 57 of the microelectronic die 54 as well as the reflowable thermal interface material 20. The bonding head 51 provides heat to the contact ring 27.

During thermal compression bonding, the contact ring 27 is urged against the heat dissipation device 52 and is superimposed over the peripheral edge 7 of the reflowable thermal interface material 20 as shown in FIG. 5C. Heat is conducted from the bonding head 50 to and through the contact ring 27, to the heat dissipation device 52 and thus into the reflowable thermal interface material 20. This heat from contact ring 27 is conducted from the peripheral edge 7 inwardly toward the center 3 of the reflowable thermal interface material 20 as indicated by the lateral arrows A1 in FIG. 5B. The heat profile H3 experienced by the reflowable thermal interface material 20 is substantially similar as the heat profile H2 of FIG. 4.

For example, in accordance with an embodiment of the present invention, the reflowable thermal interface material 20 is a solder preform. The solder preform comprises a sheet or film of reflowable thermal interface material 20 that may have lateral dimensions greater than, equal to, or less than the lateral dimensions of the die 54. Using thermal compression bonding, the reflowable thermal interface material 20 is rapidly heated to a temperature of about 157 degrees centigrade (C.), held for a period of a number of minutes, and rapidly cooled to 130 degrees C., while a pressure of between 4 and 12 kg is applied between the support base 15 and the bonding head 50. The reflowable thermal interface material 20 liquefies and solidifies during thermal compression bonding to thermally couple the microelectronic die 54 and heat dissipation device 52.

Figure 6A:
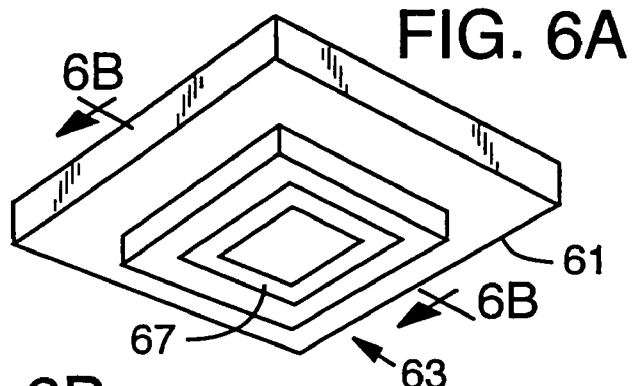
FIGS. 6A and 6B are perspective and cross-sectional views, respectively, of a bonding head of an embodiment of a thermal compression bonding apparatus in accordance with the present invention.
Figure 6B:
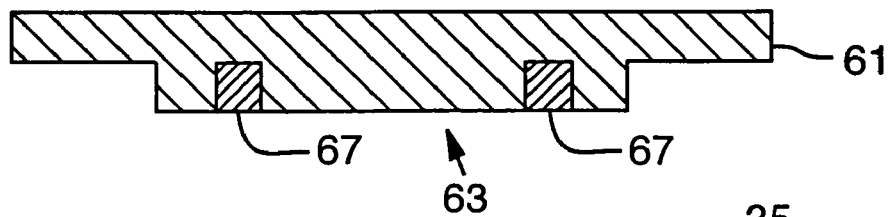

FIGS. 6A and 6B are perspective and cross-sectional views, respectively, of a bonding head 61 of an embodiment of a thermal compression bonding apparatus 60 in accordance with the present invention. The bonding head 61 comprises a contact surface 63 comprising a heat producing element 67. The heat producing element 67 is imbedded into or flush with the contact surface 63 of the bonding head 61. The heat producing element 67 is the heat source of the bonding head 61. The heat producing element 67 is in the form of a ring to correspond to the peripheral edge of the die of interest. The thermal profile produced by the heat producing element 67 to the reflowable thermal interface material 20 is substantially similar to the thermal profile H2 shown in FIG. 4.

It will be appreciated by those of ordinary skill in the art that a wide variety of alternate and/or equivalent implementations calculated to achieve progressive solidification of the reflowable thermal interface material 20 from the center 3 outward may be substituted for the specific embodiments shown and described without departing from the scope of the present invention. It is understood that the examples provided are not to be taken in a limiting sense. Additional embodiments include, but not limited to, a heat dissipation device adapted to control or impede the conduction of heat applied to the reflowable thermal interface material 20, and a reflowable thermal interface material 20 adapted to render the center 3 so as to more quickly solidify during cooling as compared to the peripheral edge 7.

There are at least two modes of bonding performed by the thermal compression bonding process; integral contact and diffusion bonding. Integral contact refers to the soft or molten reflowable thermal interface material 20 conforming to the two surfaces to be bonded, filling in any irregularities and spaces that would impede thermal conduction between the two surfaces.

Diffusion bonding is the process in which two contacting metals experience intermolecular diffusion or migration, and in some regards, may be considered an alloying of the two metals on a microlevel at the interface between the two metals. Diffusion bonds can produce superior structural and thermal coupling between the components. The success of the diffusion bond depends, on the most part, on the metals in contact, and the parameters of heat, pressure and time.

Not all metals are compatible for diffusion bonding. Intermetallics can form at the interface between two incompatible metals. Intermetallics are typically brittle and can lead to microcracking, poor thermal conductivity, and failure of the bond. Intermetallic formation between two metals is well know to those in the material arts and can be determined by referring to phase diagrams of the two metals. The use of diffusion bonding aids allow the bonding of incompatible metals by applying successive layers of different metals, each compatible between themselves, onto the surface to be bonded. This provides a metal surface that is compatible with the reflowable thermal interface material 20. Further, microelectronic dice are commonly comprised of non-metallic materials, such as silicon or gallium arsenide, among others. These non-metallic materials do not diffusion bond with metals, therefore a bonding aid is used.

Figure 7A:
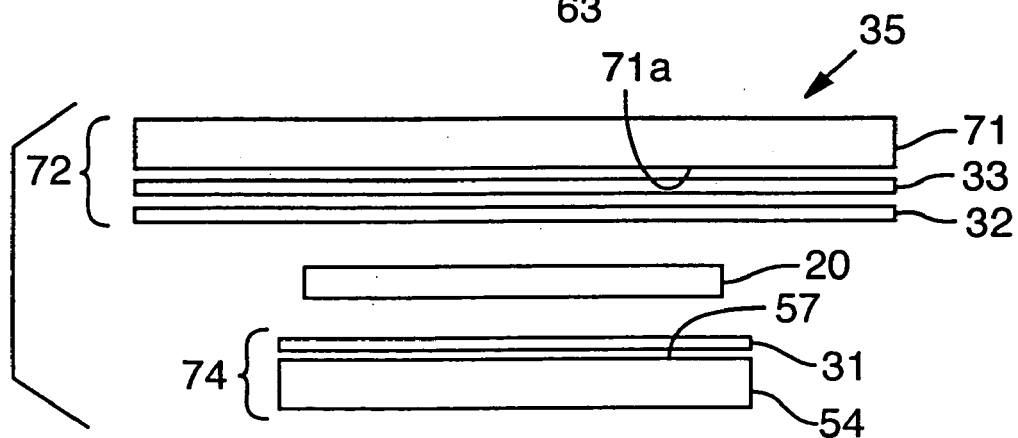
FIGS. 7A and 7B are side exploded and assembled views, respectively, of a microelectronic die and heat dissipation device with bonding aid materials in an embodiment of the present invention.
Figure 7B:
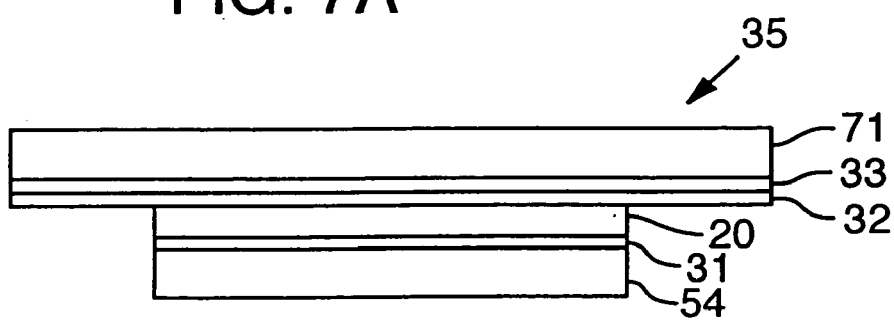

FIGS. 7A and 7B are side exploded and assembled views, respectively, of a microelectronic die 54 comprising a die bonding aid 31, and a heat dissipation device 72 comprising a first heat dissipation device bonding aid 33 and a second heat dissipation device bonding aid 32 in an embodiment of the present invention. The die bonding aid 31 is a metallic layer coupled to the back side 57 of the microelectronic die 54 using known techniques, such as plating, ion deposition, vapor deposition, and the like. In one embodiment, the die bonding aid 31 is gold. Other metals may be used if diffusion bond compatible with the base metal and the reflowable thermal interface material 20.

Similarly, in an embodiment wherein the heat dissipation device 72 is copper, the first heat dissipation device bonding aid 33 comprising nickel is deposited onto the heat dissipation device bottom surface 71a, and the second heat dissipation device bonding aid 32 comprising gold is deposited onto the first heat dissipation device bonding aid 33. Wherein gold is diffusion bond compatible with the reflowable thermal interface material 20 for a satisfactory diffusion bond under a predetermined temperature and pressure condition of thermal compression bonding.

In accordance with yet another embodiment of the present invention, the thermal compression bonding apparatus 50 as shown in FIGS. 5A-C, further comprises a bonding head 51 comprising a bonding head base 53 and a bonding head adapter 25. The bonding head base 53 comprises a raised adapter centering frame 59 defining a substantially flat head center portion 55. The head center portion 55 comprises one or more first head vacuum ports 56 and one or more second head vacuum ports 57a.

The bonding head adapter 25 comprises a substantially flat adapter back side 29 and a front side 26. The front side 26 comprises the projecting contact ring 27 that defines the inner recessed surface 28. The inner recessed surface 28 comprises one or more adapter vacuum ports 57b in substantial correspondence with the one or more second head vacuum ports 57a. The projecting contact ring 27 is adapted to accept and put into alignment the adapter back side 29 and prevent lateral movement of the bonding head adapter 25. The first head vacuum ports 56 are adapted to permit a vacuum there through to produce a suction against the adapter back side 29 so as to removably couple the bonding head adapter 25 to the bonding head base 53. The removability of the bonding head adapter 25 facilitates change-out with other bonding head adapters to accommodate other microelectronic package configurations.

The one or more second head vacuum ports 57a are arranged in substantial alignment with the one or more adapter vacuum ports 57b when the bonding head adapter 25 is coupled to the bonding head base 53. The one or more adapter vacuum ports 57b are adapted to permit a vacuum there through to produce a suction against the heat dissipation device 52 sufficient to lift and place the heat dissipation device 52 onto the microelectronic die 54. The ability of the bonding head 51 to pick up, convey and place the heat dissipation device 52 facilitates the assembly of the microelectronic package 153.

Referring again to FIGS. 5A-C, the support base 15 is adapted to support the carrier substrate 16 and, in combination with the bonding head 51, apply compressive forces to the microelectronic package 153 during thermal compression bonding. In the embodiment of FIG. 5A, the support base 15 has a substantially flat base top surface 15A to correspond with the substantially flat carrier back surface 16a of the carrier substrate 16. In other embodiments in which the carrier substrate 16 has irregular surface, the support base 15 is adapted to accommodate and support the irregular surface.

FIG. 8 is a perspective view of another embodiment of a thermal compression bonding apparatus 80 in accordance with an embodiment of the present invention. A microelectronic package 83 comprises a heat dissipation device 82 (shown as a heat slug), reflowable thermal interface material 20, a microelectronic die 54, and a carrier substrate 86. The carrier substrate 86 comprises a plurality of pins 87 projecting from a carrier substrate back side 86a. The thermal compression bonding apparatus 80 comprises a bonding head 81 and a support base 85. The support base 85 comprises a plurality of holes 88 extending into a base top surface 85a adapted to accommodate the plurality of pins 87 therein. Upon placement of the microelectronic package 83 onto the support base 85, the pins 87 are accepted by the holes 83 such that the carrier substrate back side 86a is supported by the base top surface 85a.

In accordance with yet other embodiments of the present invention, the support base 15,85 of the a thermal compression bonding apparatus 50,80 is adapted to provide heat to the microelectronic package 153,83. The heating by the support base 15,85 provides a decreased thermal gradient between the bonding head 11,51,81 and the support base 15,85. The support base 15,85 may also be used to pre-heat the microelectronic package 153,83 prior to the heating of the bonding head 11,51,81. Providing a decreased thermal gradient between the bonding head 11,51,81 and the support base 15,85 decreases the thermal shock to the microelectronic package 153,83 by the rapid heating of the bonding head 11,51,81.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of fabricating a microelectronic package, comprising:

providing a microelectronic device comprising a microelectronic die and a carrier substrate, the microelectronic die having a die active side and a die back side opposite the die active side, the carrier substrate having a substrate active side and a substrate back side opposite the substrate active side, the die active side electrically coupled to the substrate active side;

providing reflowable thermal conductive interface material on the die back side, the interface material having a peripheral edge defining a center and an interface material lateral dimension, and providing the microelectronic device with one or more die diffusion bonding aid materials on the die back side, the one or more die diffusion bonding aid materials adapted to aid in the diffusion bonding of the die to the reflowable thermal conductive interface material;

placing a thermally conductive heat dissipation device onto the interface material, the heat dissipation device having a dissipation device lateral dimension larger than the interface material lateral dimension;

applying and removing pressure and heat to the heat dissipation device opposite the interface material to be conducted through the heat dissipation device to the interface material and producing thereby liquefaction followed by solidification of the material, the solidification occurring progressively from the center to the peripheral edge.

2. The method as defined in claim 1 wherein applying pressure and heat to the heat dissipation device comprises applying pressure and heat to the heat dissipation device using a bond head comprising a contact ring defining an inner recessed portion having a ring lateral dimension smaller than the material lateral dimension, placing the contact ring in urging engagement with the heat dissipation device opposite to and overlying the peripheral edge of the material; and applying pressure and heat conducted from the bond head through the heat dissipation device to the material edge.

3. The method as defined in claim 2, further comprising applying heat to the carrier substrate and microelectronic die.

4. The method as defined in claim 1 wherein applying pressure and heat to the heat dissipation device comprises applying pressure and heat to the heat dissipation device using a bond head, the bond head comprising a contact surface having a heat producing element, the heat producing element adapted to apply heat to the material about the peripheral edge; and applying pressure and heat conducted from the bond head through the heat dissipation device to the material.

5. The method as defined in claim 1 wherein placing a thermally conductive heat dissipation device further comprises placing a thermally conductive heat dissipation device comprising a thermally conductive heat dissipation device back side having one or more thermally conductive heat dissipation device diffusion bonding aid materials, the one or more thermally conductive heat dissipation device diffusion bonding aid materials adapted to aid in the diffusion bonding of the thermally conductive heat dissipation device to the reflowable thermal conductive interface material.

6. The method as defined in claim 1 wherein placing a thermally conductive heat dissipation device onto the material, comprises placing a thermally conductive heat dissipation device onto the material, the heat dissipation device adapted to conduct heat to the material such that solidification of the material occurs progressively from the center to the peripheral edge.

* * * * *